(12) United States Patent
Lim et al.

(10) Patent No.: US 7,119,010 B2
(45) Date of Patent: Oct. 10, 2006

(54) INTEGRATED CIRCUIT WITH SELF-ALIGNED LINE AND VIA AND MANUFACTURING METHOD THEREFOR

(75) Inventors: Yeow Kheng Lim, Singapore (SG); Randall Cher Liang Cha, Singapore (SG); Alex See, Singapore (SG); Wang Ling Goh, Singapore (SG)

(73) Assignee: Chartered Semiconductor Manfacturing Ltd., Singapore (SG)

( * ) Notice: Subject to any disclaimer, the term of this patent is extended or adjusted under 35 U.S.C. 154(b) by 520 days.

(21) Appl. No.: 10/128,875

(22) Filed: Apr. 23, 2002

(65) Prior Publication Data

US 2003/0197279 A1    Oct. 23, 2003

(51) Int. Cl.
*H01L 21/4763* (2006.01)
*H01L 23/48* (2006.01)

(52) U.S. Cl. .................. 438/638; 438/675; 438/700; 257/774

(58) Field of Classification Search .............. 257/324, 257/635, 752, 758, 759, 760, 773, 774; 438/118, 438/216, 591, 622, 623, 624, 626, 631, 645, 438/687, 675, 700, 701, 713
See application file for complete search history.

(56) References Cited

U.S. PATENT DOCUMENTS 6,080,655 A * 6/2000 Givens et al. ............... 438/626
6,127,263 A * 10/2000 Parikh ........................ 438/637
6,133,139 A * 10/2000 Dalal et al. ................. 438/624
6,143,640 A * 11/2000 Cronin et al. ............... 438/618
6,153,514 A * 11/2000 Wang et al. ................. 438/640
6,316,351 B1 * 11/2001 Chen et al. .................. 438/638
6,337,269 B1 *  1/2002 Huang et al. ................ 438/618
6,475,810 B1 * 11/2002 Zhou et al. .................. 438/622
2003/0040172 A1 *  2/2003 Brennam ..................... 438/622

FOREIGN PATENT DOCUMENTS

EP          1 928 460 A2    8/2000
FR           1184903 A1 *   8/2000    ................. 21/768

* cited by examiner

*Primary Examiner*—Ori Nadav
(74) *Attorney, Agent, or Firm*—Mikio Ishimaru (57) ABSTRACT

An integrated circuit and manufacturing method therefor is provided having a base with a first dielectric layer formed thereon. A second dielectric layer is formed over the first dielectric layer. A third dielectric layer is formed in spaced-apart strips over the second dielectric layer. A first trench opening is formed through the first and second dielectric layers between the spaced-apart strips of the third dielectric layer. A second trench opening is formed contiguously with the first trench opening through the first dielectric layer between the spaced-apart strips of the third dielectric layer. Conductor metals in the trench openings form self-aligned trench interconnects.

9 Claims, 9 Drawing Sheets

INTEGRATED CIRCUIT WITH SELF-ALIGNED LINE AND VIA AND MANUFACTURING METHOD THEREFOR

TECHNICAL FIELD

The present invention relates generally to integrated circuits and more specifically to line and via interconnects for semiconductor devices.

BACKGROUND ART

Semiconductor technology has been progressing rapidly to the point where integrated circuits incorporating over a million transistors are possible. However, the rapid development of technologies, which require such integrated circuits, has increased just as rapidly. Applications such as real-time graphics, high-definition television, virtual reality, and other scientific and industrial applications are demanding higher speed, greater functionality, and even more rapid advances in very large-scale integrated circuit technology.

The demand for more functionality requires a tremendous increase in the number of transistors to be integrated onto a single integrated circuit chip. This requires shrinking the sizes of the transistors and/or having larger die sizes.

As the sizes of the transistors decrease, the resulting increased density requires an increasing number of interconnections within the integrated circuit chip. As the number of interconnections increases, the amount of area on the semiconductor die occupied by the interconnections becomes relatively large and may offset the savings made by reducing the size of the transistors.

A long sought goal in the semiconductor industry for very large-scale integrated circuits has been to achieve minimum area layouts for interconnections because minimum area layouts typically provide optimum performance and economy.

In addition, as the number of transistors proliferate, multiple levels of interconnections are required between the interconnect lines and the vias which connect different levels.

As everything is shrunk in size, misalignment comes to play a major factor in determining the performance capabilities of the interconnects. Unfavorable circumstances of misalignment can be fatal in the operation of an integrated circuit.

Further, it has been found that top misalignment between the uppermost interconnect line and a via has a great influence on via resistance and via chain yield. Small areas of line—via overlap, and incidents of via being corroded by etch clean solutions magnify the problems caused by misalignment.

Solutions to these problems have been long sought, but have equally as long eluded those skilled in the art.

DISCLOSURE OF THE INVENTION

The present invention provides an integrated circuit, and manufacturing method therefor, having a base with a first dielectric layer formed thereon. A second dielectric layer is formed over the first dielectric layer. A third dielectric layer is formed in spaced-apart strips over the second dielectric layer. A first trench opening is formed through the first and second dielectric layers between the spaced-apart strips of the third dielectric layer. A second trench opening is formed contiguously with the first trench opening through the first dielectric layer between the spaced-apart strips of the third dielectric layer. Conductor metals, such as aluminum or copper are deposited in the trench openings to form self-aligned trench interconnects. This self-aligned patterning technique achieves self-aligning interconnects which avoid misalignment and enhance the performance capabilities of the interconnects.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
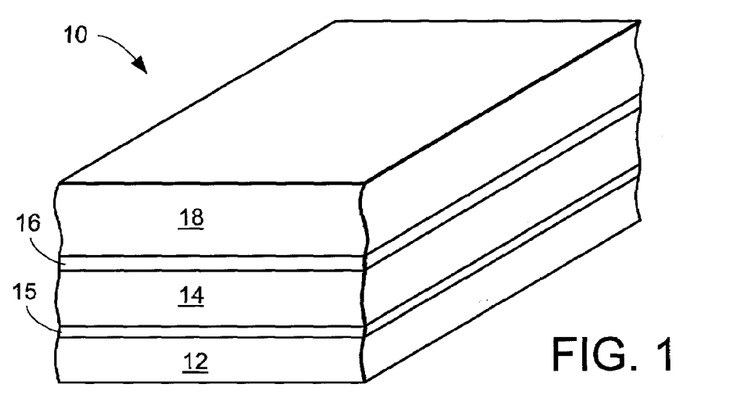
FIG. 1 is a view of a portion of an integrated circuit in an intermediate stage of manufacture in accordance with the present invention.

Referring now to FIG. 1, therein is shown a portion of an integrated circuit in an intermediate stage of manufacture according to the present invention. The integrated circuit interconnect 10 is built on a base 12 which may be a semiconductor substrate, silicon for a silicon-on-insulator (SOI) structure, a dielectric layer, a stop layer, or other lines, vias, or contacts. The other lines, vias, and contacts would be connected to semiconductor devices on, in, or under the semiconductor substrate, silicon-on-insulator, dielectric layers, or stop layers. In the present invention, the first dielectric layer 14 is already deposited on an initial stop layer 15 over the base 12. The dielectric layers herein may be materials such as silicon oxide, silicon nitride, or low dielectric constant dielectric material having a dielectric constant under about 3.9.

A first stop layer 16 is also already deposited on the first dielectric layer 14 and a second dielectric layer 18 is also already deposited over the first stop layer 16. The term "stop layer" is used as a matter of convenience herein because such a layer is generally used to stop various etching processes although it does not necessarily have to perform this function. The stop layers may be a material such as silicon nitride or silicon oxide.

The term "horizontal" as used in herein is defined as a plane parallel to the conventional plane or surface of a wafer, such as the base 12, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
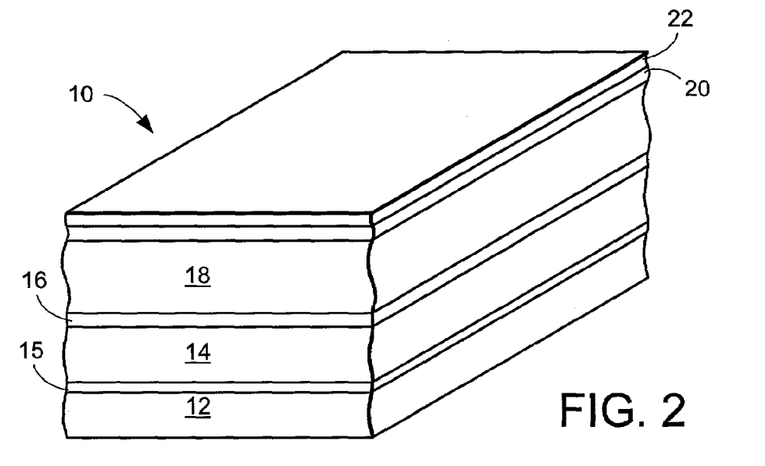
FIG. 2 is the structure of FIG. 1 after depositing a protective dielectric layer and a second stop layer.

Referring now to FIG. 2, therein is shown the structure of FIG. 1 with the deposition of a protective dielectric layer 20 and a second stop layer 22. The protective dielectric layer 20 is optional and is used primarily with low dielectric constant dielectric materials to prevent them from being poisoned by subsequent depositions of photoresist.

Figure 3:
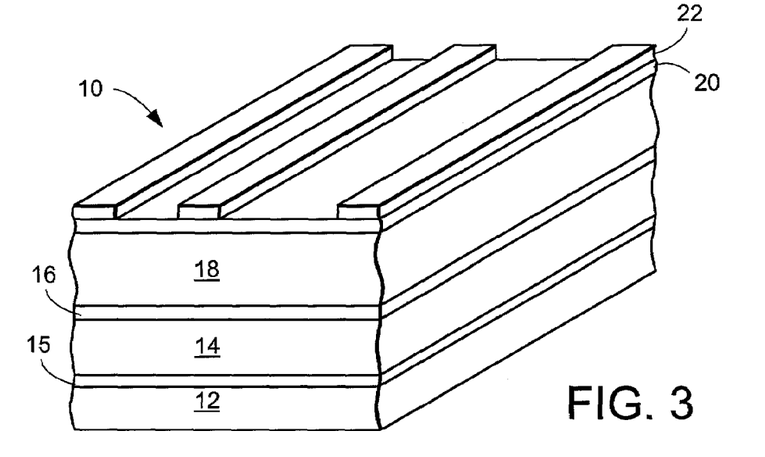
FIG. 3 is the structure of FIG. 2 after patterning the second stop layer with a trench mask and removing a portion of the second stop layer to expose portions of the second dielectric layer.

Referring now to FIG. 3, therein is shown the structure of FIG. 2 after patterning of the second stop layer 22 with a trench mask and processing to remove a portion of the second stop layer 22 and expose portions of the protective dielectric layer 20.

Figure 4:
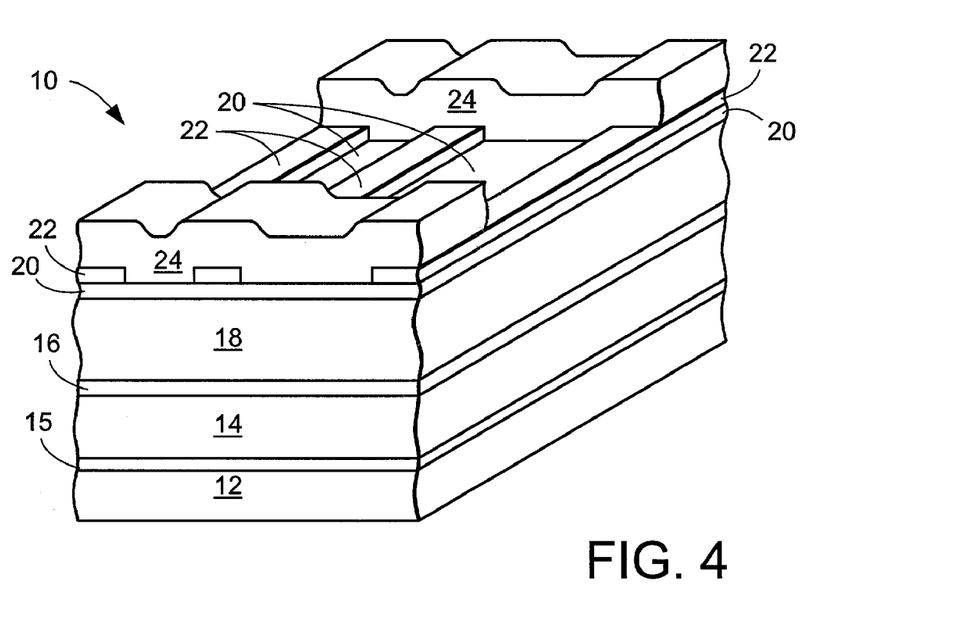
FIG. 4 is the structure of FIG. 3 after depositing, patterning, and processing of a photoresist layer with a via mask.

Referring now to FIG. 4, therein is shown the structure of FIG. 3 after deposition, patterning, and processing of a conformal photoresist layer 24 which is patterned with a via mask. The conformal photoresist layer 24 and the second stop layer 22 cooperate to expose generally rectangular areas of the protective dielectric layer 20. It will be understood by those skilled in the art that a dielectric layer, which may be the protective dielectric layer 20 or the second dielectric layer 18, may be exposed in any desired configuration so that the resulting vias may be round, square, or otherwise.

Figure 5:
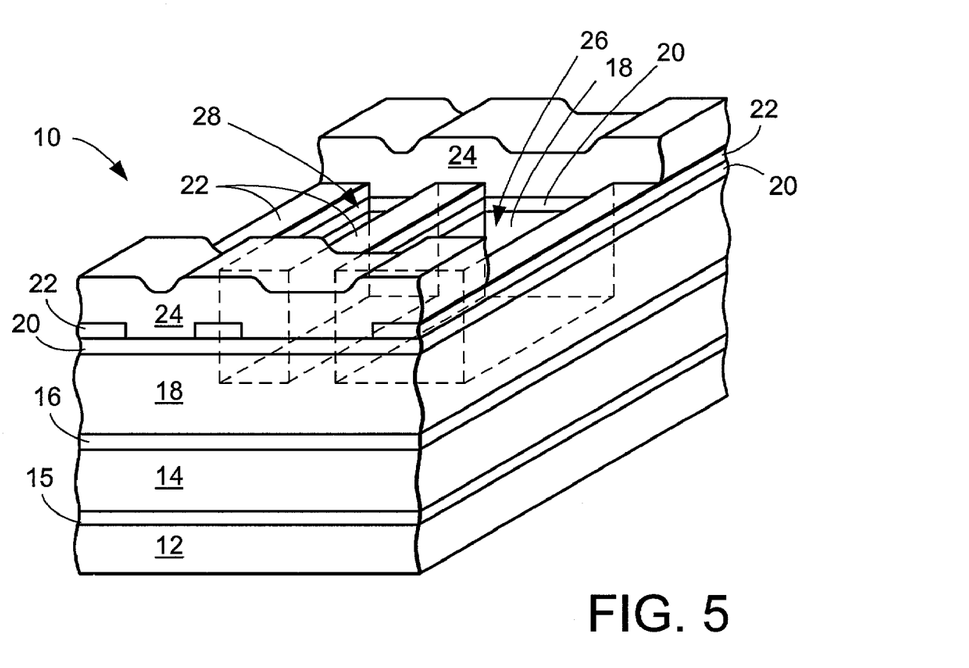
FIG. 5 is the structure of FIG. 4 after etching to form the beginning of vias.

Referring now to FIG. 5, therein is shown the structure of FIG. 4 having been anisotropically etched to form vias 26 and 28. The vias 26 and 28 are etched through the protective dielectric layer 20, the second dielectric layer 18 to the first stop layer 16.

Figure 6:
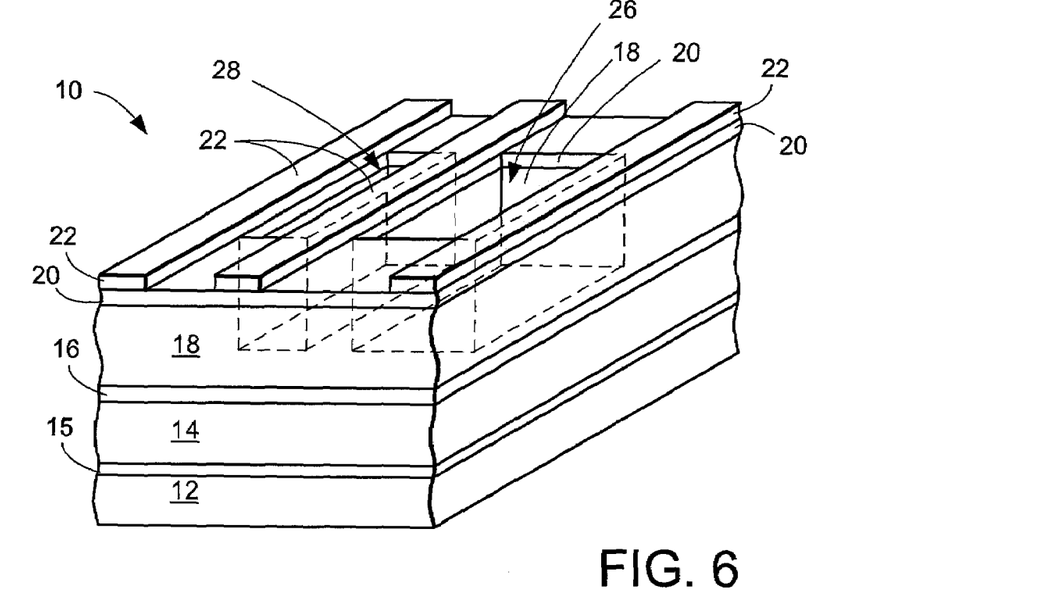
FIG. 6 is the structure of FIG. 5 after removing the photoresist layer.

Referring now to FIG. 6, therein is shown the structure of FIG. 5 after removal of the conformal photoresist layer 24 in preparation for formation of the interconnect lines.

Figure 7:
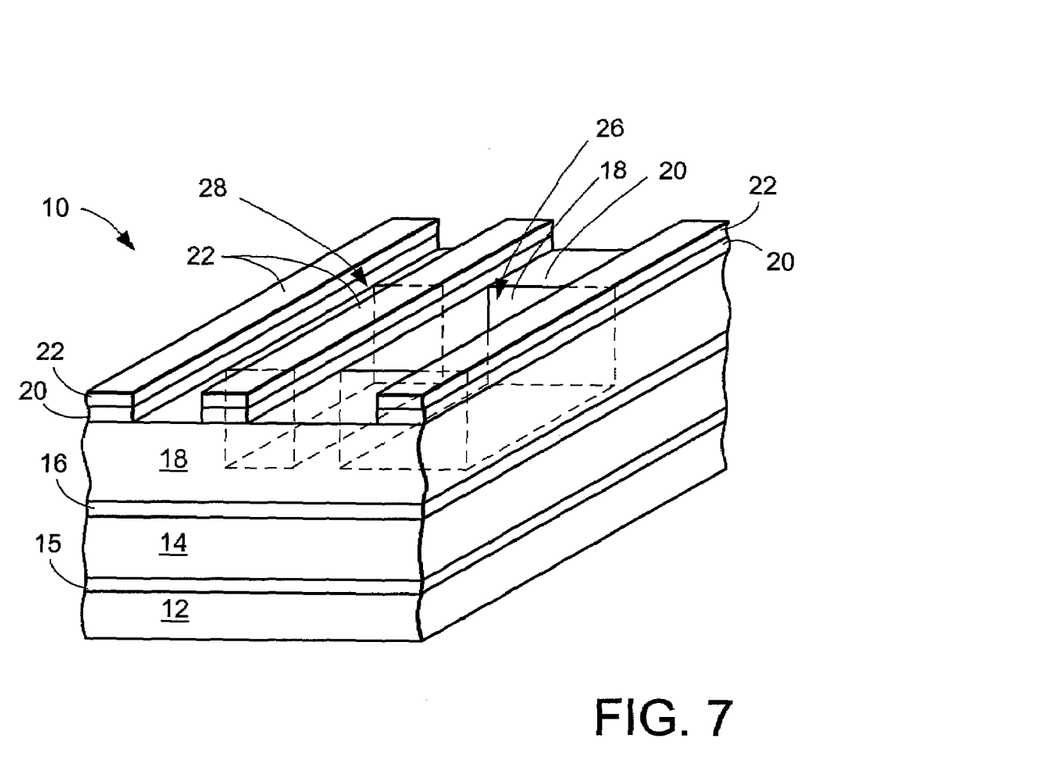
FIG. 7 is the structure of FIG. 6 after removing the protective dielectric layer to expose the second dielectric layer.

Referring now to FIG. 7, therein is shown the structure of FIG. 6 after removal by anisotropic etching of the protective dielectric layer 20 to expose the second dielectric layer 18.

Figure 8:
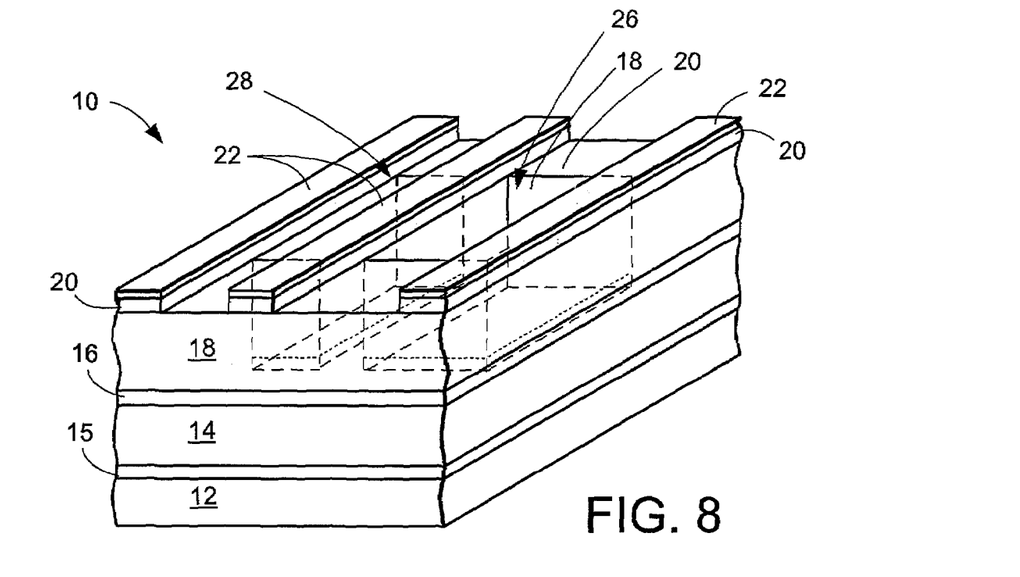
FIG. 8 is the structure of FIG. 7 after etching through the first stop layer and optionally etching the second stop layer.

Referring now to FIG. 8, therein is shown the structure of FIG. 7 after etching through the first stop layer 16 and optionally etching the second stop layer 22.

Figure 9:
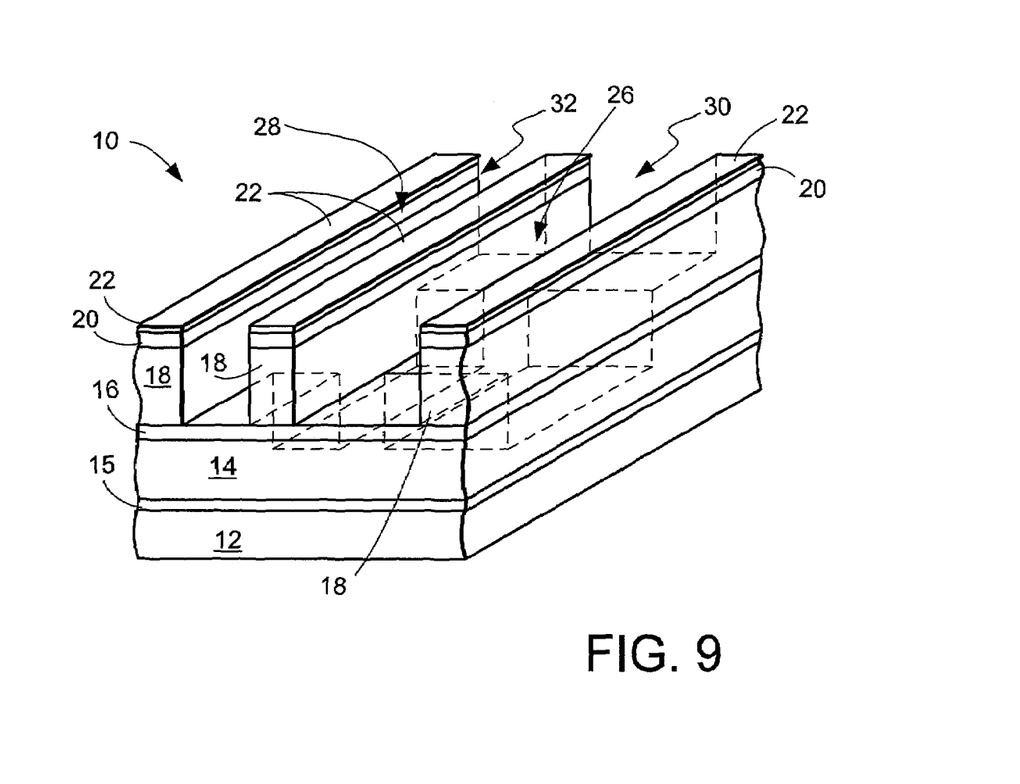
FIG. 9 is the structure of FIG. 8 after removing the second dielectric layer down to the first stop layer and removing the first dielectric layer down to an initial stop layer forming the interconnect line openings intersecting the via openings.

Referring now to FIG. 9, therein is shown the structure of FIG. 8 after removal by anisotropic etching of the exposed second dielectric layer 18 down to the first stop layer 16 and the first dielectric layer 14 down to the initial stop layer 15. This step forms the interconnect line openings 30 and 32 which precisely intersect the respective via openings 26 and 28 such that the widths of the contiguous openings between first dielectric layer 14 and the second dielectric layer 18 are exactly the same and self-aligned.

Figure 10:
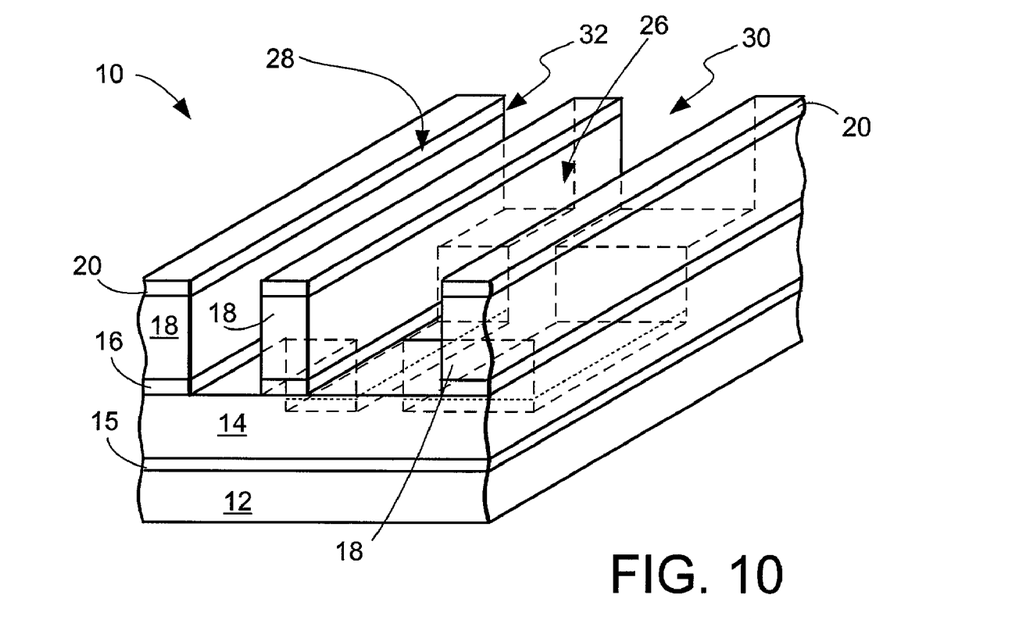
FIG. 10 is the structure of FIG. 9 after etching of the first stop layer and initial stop layer.

Referring now to FIG. 10, therein is shown the structure of FIG. 9 after etching of the first stop layer 16 and the initial stop layer 15. The etching of the initial stop layer is for connection to other structures of the integrated circuit such as semiconductor transistors or other components (not shown).

Figure 11:
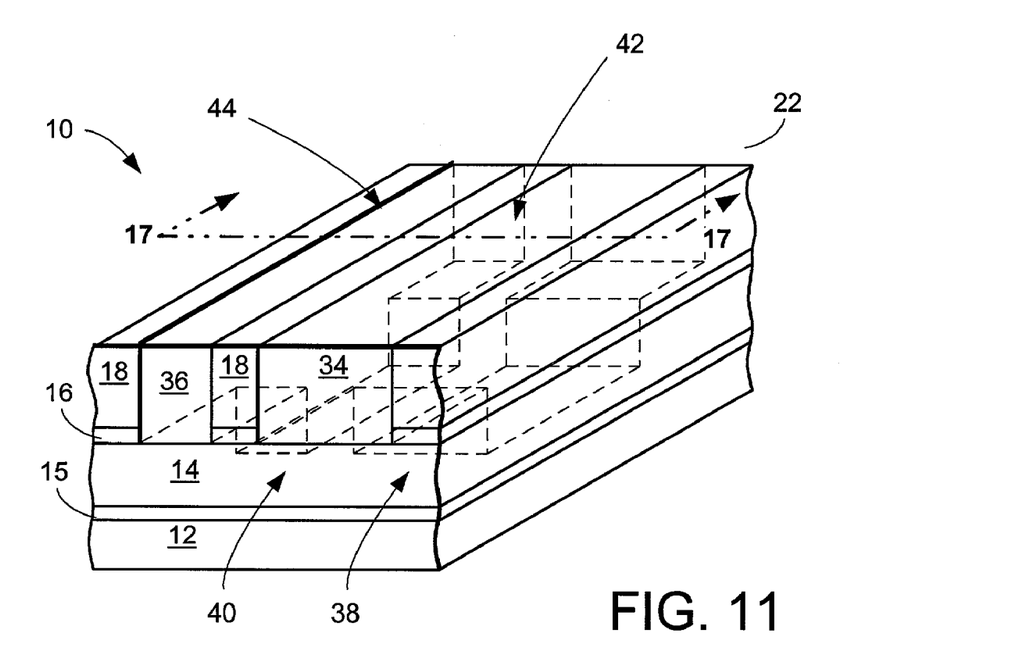
FIG. 11 is the completed interconnect in accordance with the present invention.

Referring now to FIG. 11, therein is shown the completed interconnect 10 in accordance with the present invention. With the via openings 26 and 28 and the interconnect line openings 30 and 32 (of FIG. 10) being respectively filled by conductive metals 34 and 36, vias 38 and 40 form a borderless interconnection with interconnect lines 42 and 44, respectively. It will be understood that various conductive metals may be used including aluminum and copper. Copper will have a diffusion barrier deposited first.

Because the via level and the interconnect level are formed at the same time, this method of formation would be described as a dual inlaid or dual damascene technique borderless interconnect.

Figure 12:
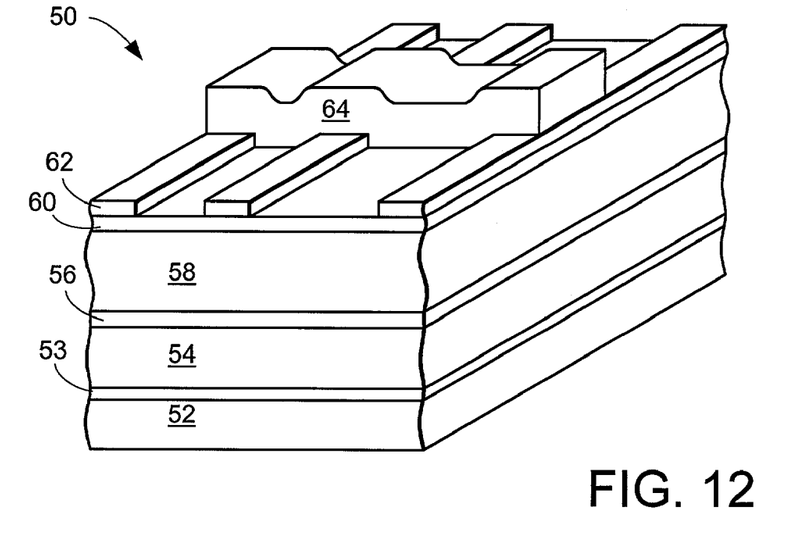
FIG. 12 is a view of an alternate embodiment of an interconnect in an intermediate stage of manufacture.

Referring now to FIG. 12, therein is shown an alternate embodiment of an interconnect 50 in an intermediate stage of manufacture. In FIG. 12, the equivalent steps as shown in FIGS. 1–3 have been completed. A base 52 has an initial stop layer 53 and a first dielectric layer 54 deposited thereon. A first stop layer 56 is deposited on the first dielectric layer 54 and a second dielectric layer 58 is deposited on the first stop layer 56. A protective dielectric layer 60 is optionally deposited on the second dielectric layer 58 when it is a low dielectric constant dielectric material.

A second stop layer 62 has been deposited and patterned and a photoresist layer 64 has been deposited on the second stop layer 62 and processed so that the second stop layer 62 and the photoresist layer 64 cooperate to expose via or deep trench areas on the protective dielectric layer 60. In this configuration, the photoresist layer 64 overlays the center of the interconnect 50.

Figure 13:
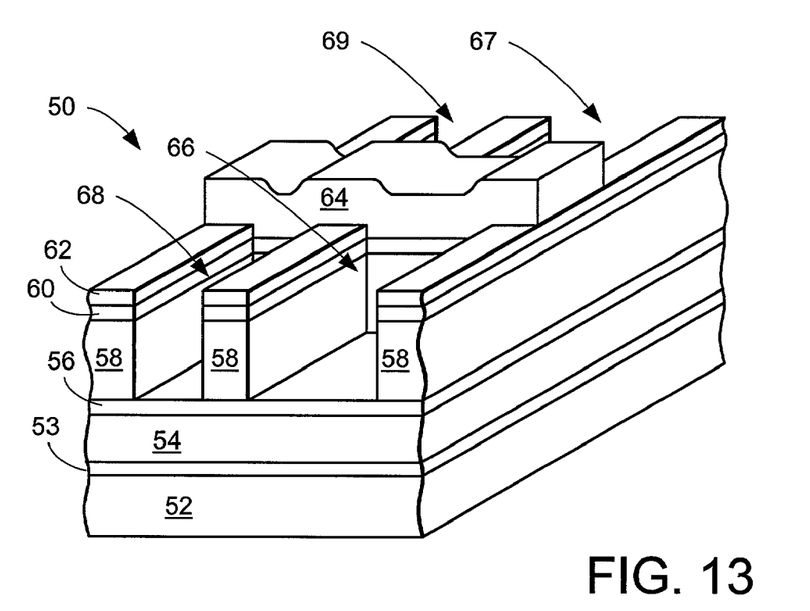
FIG. 13 is the structure of FIG. 12 after etching for deep trenches.

Referring now to FIG. 13, therein is shown the structure of FIG. 12 having been anisotropically etched for deep trenches 66 through 69. The deep trenches 66 through 69 are etched through the protective dielectric layer 60, the second dielectric layer 58, the first stop layer 56, and the first dielectric layer 54, down to the initial stop layer 53.

Figure 14:
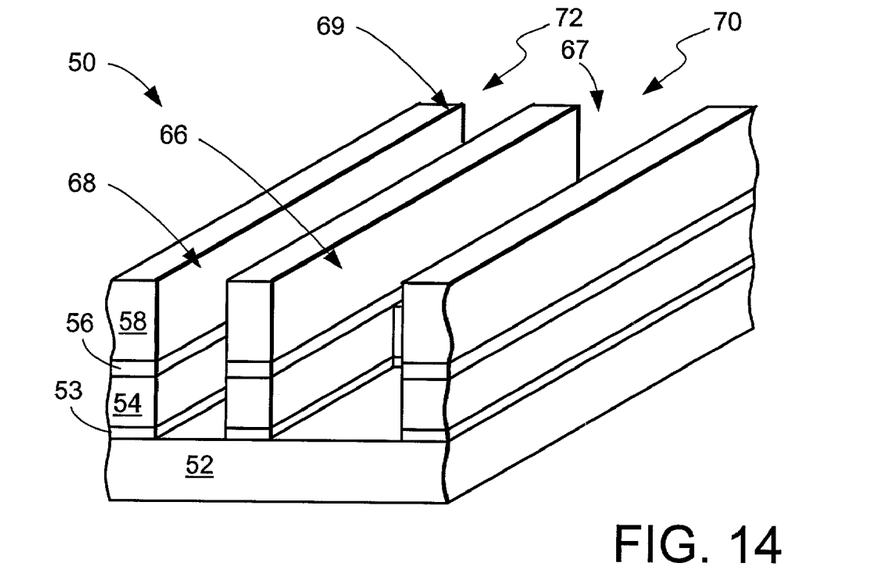
FIG. 14 is the structure of FIG. 13 after forming the interconnect line openings and intersecting deep trenches.

Referring now to FIG. 14, therein is shown the structure of FIG. 13 after removal of the photoresist layer 64 and the protective dielectric layer 60. A removal process by anisotropic etching of the second dielectric layer 58 and the first dielectric layer 54 have been performed down to the first stop layer 56 and initial stop layer 53, respectively. Subsequently, the first stop layer 56 and the initial stop layer 53 have also been removed by anisotropic etching so as to form the interconnect line openings 70 and 72 which precisely intersect the respective deep trenches 66–67 and 68–69 such that the widths of the contiguous openings between the first dielectric layer 54 and the second dielectric layer 58 are exactly the same and self-aligned.

Figure 15:
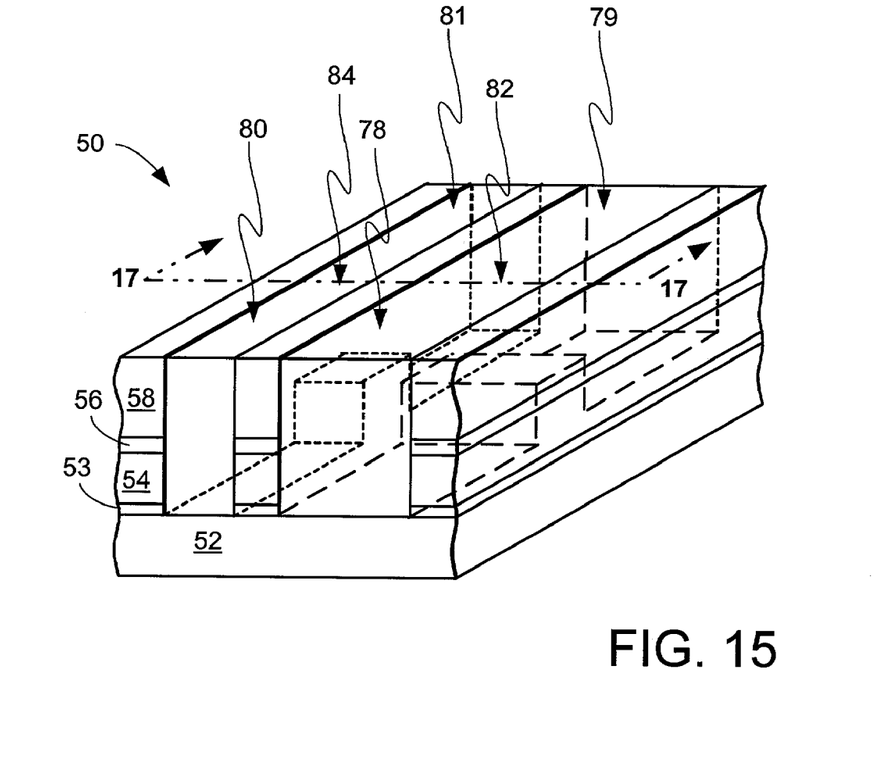
FIG. 15 is the structure of FIG. 14 after depositing conductor metal to form the interconnect lines and intersecting vias.

Referring now to FIG. 15, therein is shown the structure of FIG. 14 after deposition of conductor metals 74 and 76, which will form deep trenches 78–81 connected by shallow trenches 82 and 84, respectively. The completed structure of the interconnect 50 will be a dual inlaid or dual damascene technique borderless interconnect.

Figure 16:
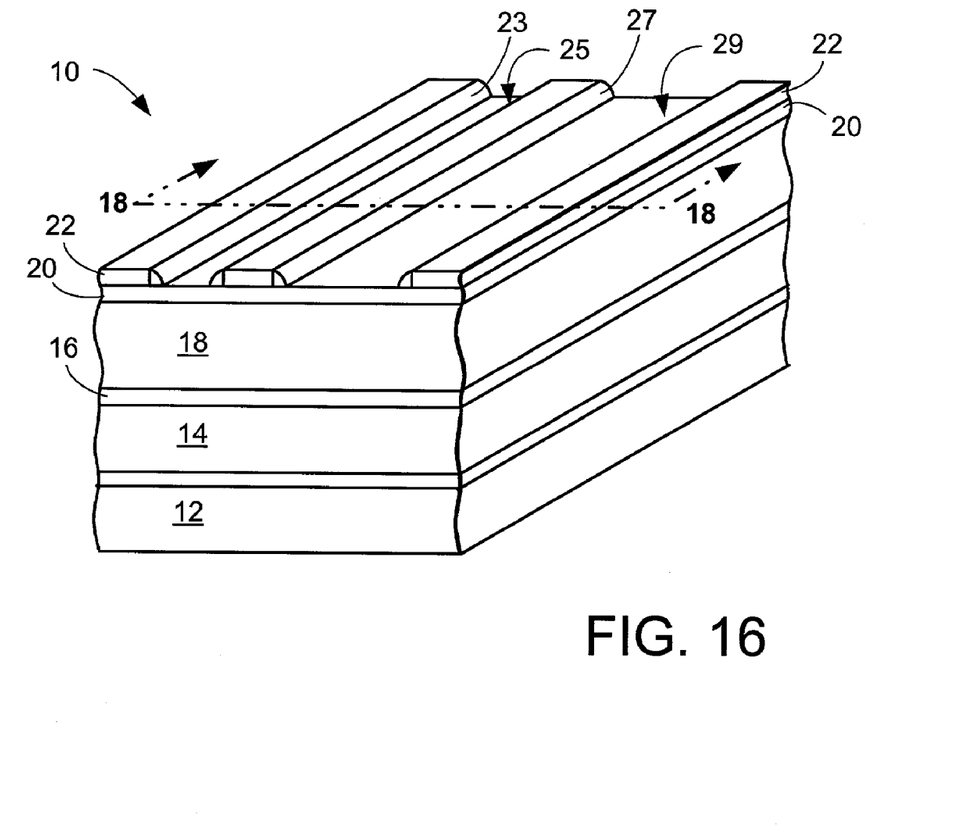
FIG. 16 is the structure of FIG. 3 further modified with an additional layer of dielectric deposited thereon to form spacers in a further alternate embodiment of the present invention.

Referring now to FIG. 16, therein is shown a further alternate embodiment wherein the structure of FIG. 3 has an additional layer of dielectric deposited thereon which is patterned and processed in a conventional manner to form dielectric spacers 23, 25, 27, and 29. As would be evident to those skilled in the art, this would permit the manufacture of the previous structures described herein to result in bordered structures wherein the upper layers of conductor metal are larger than the lower layers of conductor metal so that, while the self-alignment characteristics are maintained, the interconnect lines will be wider than the width of the vias by the width of the spacers.

Figure 17:
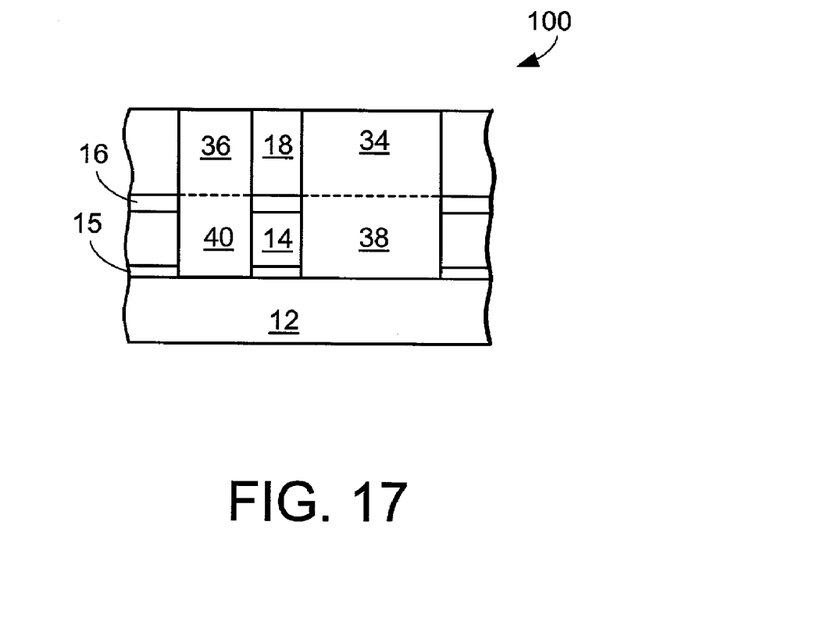
FIG. 17 is a cross-section of FIG. 11 along line 17—17.

Referring now to FIG. 17, therein is shown a cross-section of a dual inlaid or dual damascene technique borderless interconnect 100 taken along line 17—17 of FIG. 11 for clarity with via 38 borderless with channel 34 and the via 40 borderless with the channel 36.

Figure 18:
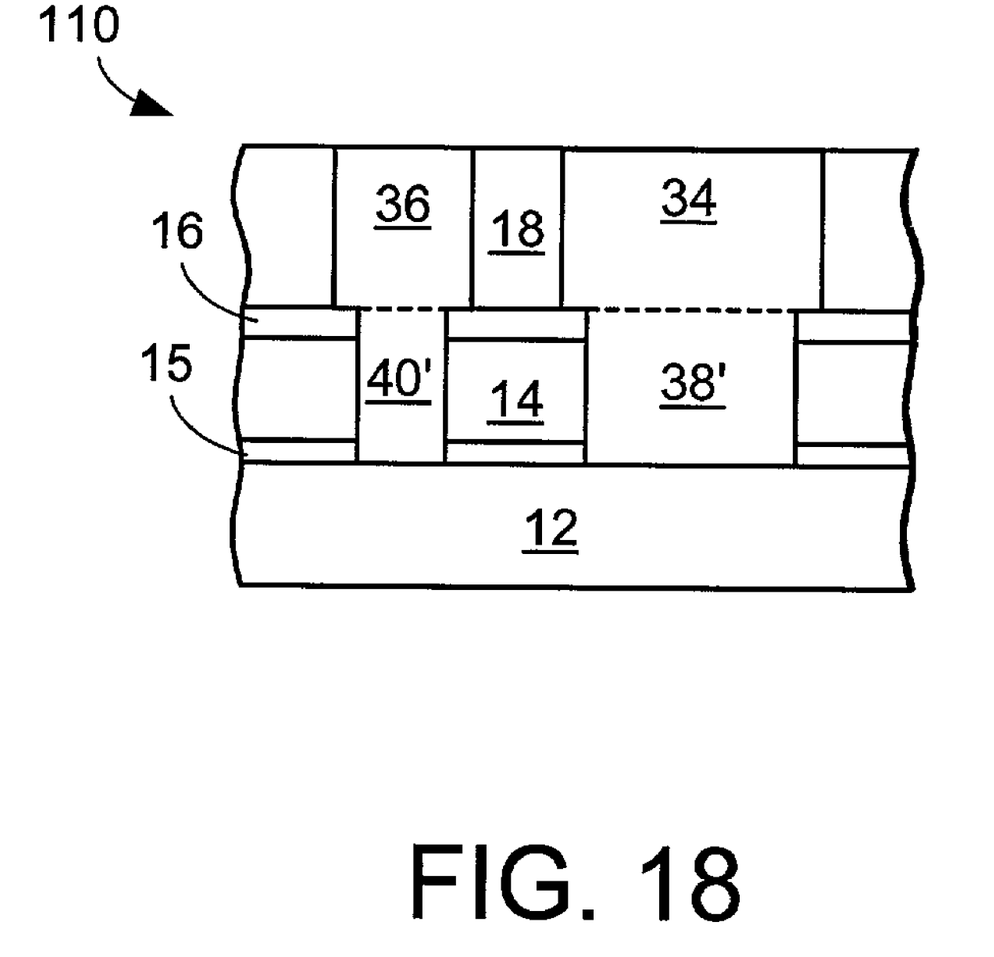
FIG. 18 is a cross-section of FIG. 16 along line 18—18.

Referring now to FIG. 18, therein is shown a cross-section of a dual inlaid or dual damascene technique bordered interconnect 110 taken along line 18—18 of a completed version of FIG. 16 for clarity with the via 38' smaller than the channel 34 and the via 40' smaller than the channel 36. The dielectric spacers 23, 25, 27, and 29 have been used in etching the vias 38' and 40' and then are removed. The channels 34 and 36 are then etched without the dielectric spacers 23, 25, 27, and 29 and are wider by their width.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hitherto-fore set forth herein or shown in the accompanying drawings are to be interpreted in an illustrative and non-limiting sense.

The invention claimed is:

1. A method used in manufacturing an integrated circuit comprising:
    providing a base;
    depositing a first dielectric layer over the base;
    depositing a second dielectric layer over the first dielectric layer;
    depositing a third dielectric layer over the second dielectric layer;
    processing the third dielectric layer to open a first trench portion of the second dielectric layer;
    depositing a photoresist over the second and third dielectric layers;
    processing the photoresist to open a second trench portion of the first trench portion of the second dielectric layer;
    removing the first and second dielectric layers under the second trench portion to form a first trench opening;
    removing the photoresist;
    removing the second dielectric layer under the first trench portion to form a second trench opening; and
    depositing conductor in the first and second trench openings to form a first and second trench interconnect.

2. The method used in manufacturing an integrated circuit as claimed in claim 1 wherein:
    processing the photoresist includes opening a third trench portion of the first trench portion of the second dielectric layer;
    removing the first and second dielectric layers includes removing the first and second dielectric layers under the third trench portion to form a third trench opening; and
    depositing the conductor includes depositing the conductor in the third trench opening to form an interconnect connecting the first and third trenches.

3. The method used in manufacturing an integrated circuit as claimed in claim 1 wherein:
    depositing the conductor includes processing a mask open to the first trench opening and in which the conductor is deposited to form an interconnect connected to the first trench.

4. The method used in manufacturing an integrated circuit as claimed in claim 1 including:
    depositing a dielectric protection layer over the second dielectric layer before depositing the photoresist.

5. The method used in manufacturing an integrated circuit as claimed in claim 1 including:
    depositing first and second stop layers over the first and second dielectric layers.

6. A method used in manufacturing an integrated circuit comprising:
    providing a base;
    depositing a first dielectric layer over the base;
    depositing a first stop layer over the first dielectric layer;
    depositing a second dielectric layer over the first stop layer;
    depositing a second stop layer over the second dielectric layer;
    processing the second stop layer to open a first trench portion of the second dielectric layer;
    depositing a photoresist over the second dielectric layer and second stop layers;
    processing the photoresist to expose a second trench portion of the first trench portion of the second dielectric layer;
    removing the first and second dielectric layers and the first stop layer under the second trench portion to form a first trench opening;
    removing the photoresist;
    removing the second dielectric layer under the first trench portion to form a second trench opening; and
    depositing conductor in the first and second trench openings to form a first and second trench, self-aligned interconnect.

7. The method used in manufacturing an integrated circuit as claimed in claim 6 wherein:
    processing the photoresist includes opening a third trench portion of the first trench portion of the second dielectric layer;
    removing the first and second dielectric layers includes removing the first and second dielectric layers and the first stop layer under the third trench portion to form a third trench opening; and
    depositing the conductor includes depositing the conductor in the third trench opening to form a self-aligned interconnect connecting the first and third trenches.

8. The method used in manufacturing an integrated circuit as claimed in claim 6 wherein:
    depositing the conductor uses a mask processed to open to the first trench opening and in which the conductor is deposited to form a self-aligned interconnect connected to the first trench.

9. The method used in manufacturing an integrated circuit as claimed in claim 6 wherein:
    depositing the second dielectric layer deposits a material having a dielectric constant below 3.9; and
    depositing a dielectric protection layer over the second dielectric layer before depositing the photoresist.

* * * * *